(12) United States Patent
Kim et al.

(10) Patent No.: US 9,876,518 B2
(45) Date of Patent: Jan. 23, 2018

(54) CAPACITIVE PASSIVE MIXER BASEBAND RECEIVER WITH BROADBAND HARMONIC REJECTION

(71) Applicant: The Regents of the University of California, Oakland, CA (US)

(72) Inventors: Chul Kim, La Jolla, CA (US); Chris Michael Thomas, San Diego, CA (US); Gert Cauwenberghs, San Diego, CA (US); Lawrence E. Larson, Providence, RI (US); Siddharth Joshi, La Jolla, CA (US); Sohmyung Ha, La Jolla, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 15/273,536

(22) Filed: Sep. 22, 2016

(65) Prior Publication Data

US 2017/0141805 A1    May 18, 2017

Related U.S. Application Data

(60) Provisional application No. 62/222,126, filed on Sep. 22, 2015.

(51) Int. Cl.
*H04B 1/16* (2006.01)
*H04L 27/22* (2006.01)
*H03H 7/01* (2006.01)

(52) U.S. Cl.
CPC ............. *H04B 1/16* (2013.01); *H03H 7/0138* (2013.01); *H04L 27/22* (2013.01)

(58) Field of Classification Search
CPC .......... H04B 1/16; H03H 7/0138; H03H 7/01; H04L 27/22
See application file for complete search history.

(56) References Cited

U.S. PATENT DOCUMENTS 4,789,837 A  * 12/1988 Ridgers .................. G06G 7/161
                                                         327/113
7,738,851 B2     6/2010 Cooley et al.
(Continued)

OTHER PUBLICATIONS

A. Rafi et al., "Harmonic rjection mixing techniques using clock-gating", IEEE J. Of Solid-State Circuits, vol. 48, No. 8, pp. 1862-1874, Aug. 2013.
(Continued)

*Primary Examiner* — Pablo Tran
(74) *Attorney, Agent, or Firm* — Mintz Levin Cohn Ferris Glovsky and Popeo, P.C.

(57) ABSTRACT

Systems, methods, and articles of manufacture, including computer program products, are provided for capacitive passive mixer baseband receivers with broadband harmonic rejection. In some embodiments, an apparatus is provided. The apparatus includes a receiver configured to receive an input signal and generate, based on the input signal, an in-phase portion and a quadrature phase portion. The apparatus further includes a harmonic rejection mixer comprising a plurality of capacitors, the plurality of capacitors encoded with a plurality of capacitance values, the harmonic rejection mixer configured to reduce harmonics in the input signal based on applying a quantity of the plurality of capacitance values to the input signal. The apparatus further includes a plurality of switches configured to activate the plurality of capacitors, the quantity of the plurality of predetermined capacitance values applied to the input signal based on a quantity of the plurality of capacitors that are active.

19 Claims, 9 Drawing Sheets

(56) References Cited

U.S. PATENT DOCUMENTS

| | | | |
|---|---|---|---|
| 8,138,817 B2 | 3/2012 | Brekelmans et al. | |
| 8,212,416 B2* | 7/2012 | Navid | H01F 17/04 307/105 |
| 8,374,570 B2* | 2/2013 | Seendripu | H03D 3/007 455/258 |
| 8,760,223 B2* | 6/2014 | Fujikawa | H03K 17/04123 327/382 |
| 8,977,211 B1* | 3/2015 | Tinella | H04B 17/00 455/231 |
| 9,197,161 B2* | 11/2015 | Asuri | H03D 7/18 |
| 9,246,465 B2* | 1/2016 | van Veldhoven | |
| 9,602,021 B2* | 3/2017 | Chaudhuri | H02M 5/4585 |
| 9,692,464 B1* | 6/2017 | Cheng | H04B 1/0475 |
| 2003/0095421 A1* | 5/2003 | Kadatskyy | H02M 1/34 363/65 |
| 2013/0187828 A1* | 7/2013 | Desclos | H03H 7/38 343/861 |

OTHER PUBLICATIONS

A. Rafi, et al., "A harmonic rejection mixer roubst to RF device mismatches," Solid-State Circuits Conference Digest of Technical Papers(ISSCC), 2011 IEEE International, pp. 66-68, Feb. 20-24, 2011.

Behbahani, F., et al., "CMOS Mixers and Polyphase Filters for Large Image Rejection", IEEE Journal of Solid-State Circuits, vol. 36, No. 6, Jun. 2001. pp. 873-887.

Borremans, Jonathan, et al. "A 0.9 V low-power 0.4-6GHz linear SDR receiver in 28nm CMOS." VLSI Circuits (VLSIC), 2013 Symposium on. IEEE, 2013.

Celik, Abdullah, Milutin Stanacevic, and Gert Cauwenberghs. "Gradient flow independent component analysis in micropower VLSI." NIPS. 2005.

D. Murphy, et al., "A noise-cancelling receiver with enchanced resilience to harmonic blockers," ISSCC Dig. Tech. Papers, pp. 68-69, Feb. 2014.

Di Biase, Luigi, et al. "Ablation of stable VTs versus substrate ablation in ischemic cardiomyopathy: the VISTA randomized multicenter trial." Journal of the American College of Cardiology 66.25 (2015): 2872-2882.

Ding, Ming, et al. "26.2 A 5.5 fJ/conv-step 6.4 MS/S 13b SAR ADC utilizing a redundancy-facilitated background error-detection-and-correction scheme." Solid-State Circuits Conference-(ISSCC), 2015 IEEE International. IEEE, 2015.

FCC, "In the matter of the unlicensed operation in the TV broadcast bands/ Additional spectrum for unlicensed devices below 900 MHz in the 3 GHz band", FCC, Tech. Rep., 2010.

Ghaffari, Amir, et al. "Simultaneous spatial and frequency-domain filtering at the antenna inputs achieving up to+ 10dBm out-of-band/ beam P 1dB," Solid-State Circuits Conference Digest of Technical Papers (ISSCC), 2013 IEEE International. IEEE, 2013.

H. Cha, et al., "A CMOS Wideband RF Front-END with Mismatch Calibrated Harmonin Rejection Mixer for Terrestrial Digital TV Tuner Applications," Microwave Theory and Techniques, IEEE Transactions on, vol. 58, No. 8, pp. 2143-2151, Aug. 2010.

H.-K Cha et al., "A CMOS harmonic rejection mixer with mismatch calibration circuitry for digital TV tuner applications", IEEE Microw. Compon. Lett., vol. 18, No. 9, pp. 617-619, Sep. 2008.

Haissaguerre, Michel, et al. "Driver domains in persistent atrial fibrillation." Circulation (2014): Circulationaha-113.

Haykin, Simon. "Cognitive radio: brain-empowered wireless communications." IEEE journal on selected areas in communications 23.2 (2005): 201-220.

J. Weldon, et al., "A 1.75-GHz Highly Integrated Narrow-Band CMOS Transmitter with Harmonic-Rejection Mixers," IEEE Journal of Solid-State Circuits, vol. 36, No. 12, pp. 2003-2015. Dec. 2001.

Kim, Chul, et al. "A 105dB-gain 500MHz-bandwidth 0.1 Ω-output-impedance amplifier for an amplitude modulator in 65nm CMOS." Solid-State Circuits Conference Digest of Technical Papers (ISSCC), 2010 IEEE International. IEEE, 2010.

Kim, Chul, et al. "A 7.86 mW+ 12.5 dBm in-band IIP3 8-to-320 MHz capacitive harmonic rejection mixer in 65nm CMOS." European Solid State Circuits Conference (ESSCIRC), ESSCIRC 2014-40th. IEEE, 2014.

Kim, Chul, et al. "A CMOS 4-channel MIMO baseband receiver with 65dB harmonic rejection over 48MHz and 50dB spatial signal separation over 3MHz at 1.3 mW." VLSI Circuits (VLSI Circuits), 2015 Symposium on. IEEE, 2015.

Le, Bin, et al. "Analog-to-digital converters." IEEE Signal Processing Magazine 22.6 (2005): 69-77.

Le, V.H, et al., "A Passive Mixer for a Wideband TV Tuner", IEEE Transactions on Circuits and Systems-II: Express Briefs, vol. 58, No. 7, Jul. 2011. pp. 398-401.

M. Notten et al., "A cmos quadrature down-conversion mixer with analog I/Q correction obtaining 55 dB of image rejection for TV on mobile application", in IEEE RFIC Symposium, 2006.

M. Soer et al., "A 0.2-to-2.0GHz 65nm CMOS receiver without LNA achieving>> 11dbm IIP3 and << 6.5 dB NF", in IEEE ISSCC Dig. Tech. Papers. 2009.

Murphy, David, Hooman Darabi, and Hao Xu. "A noise-cancelling receiver resilient to large harmonic blockers." IEEE Journal of Solid-State Circuits 50.6 (2015): 1336-1350.

R. Bagheri et al., "An 800MHz to 5GHz software-defined radio receiver in 90nm CMOS", in IEEE ISSCC Dig. Tech. Papers, 2006.

Razavi, Behzad. "Challenges in the design of cognitive radios1." CICC. 2009.

Razavi, Behzad. "Cognitive radio design challenges and techniques." IEEE Journal of Solid-State Circuits 45.8 (2010): 1542-1553.

Rebeiz, Eric, et al. "Energy-efficient processor for blind signal classification in cognitive radio networks." IEEE Transactions on Circuits and Systems I: Regular Papers 61.2 (2014): 587-599.

Song, Bang-Sup, "Micro CMOS Design," CRC Press, 2012.

Thomas, Chris M., and Lawrence E. Larson. "Broadband synthetic transmission-line N-path filter design." IEEE Transactions on Microwave Theory and Techniques 63.10 (2015): 3525-3536.

van den Heuvel, Johan HC, and Danijela Cabric. "Spatial filtering approach for dynamic range reduction in cognitive radios." Personal Indoor and Mobile Radio Communications (PIMRC), 2010 IEEE 21st International Symposium on. IEEE, 2010.

van den Heuvel, Johan HC, et al. "Full MIMO spatial filtering approach for dynamic range reduction in wideband cognitive radios." IEEE Transactions on Circuits and Systems I: Regular Papers 59.11 (2012): 2761-2773.

van Liempd, Barend, et al. "IIP2 and HR calibration for an 8-phase harmonic recombination receiver in 28nm." Custom Integrated Circuits Conference (CICC), 2013 IEEE. IEEE, 2013.

Venkateswaran, Vijay, and Alle-Jan van der Veen. "Analog beamforming in MIMO communications with phase shift networks and online channel estimation." IEEE Transactions on Signal Processing 58.8 (2010): 4131-4143.

Walden, Robert H. "Analog-to-digital converter survey and analysis." IEEE Journal on selected areas in communications 17.4 (1999): 539-550.

Y.M. Chi et al., "Ultra-high input impedance, low noise integrated amplifier for noncontact biopential sensing", IEEE J. Emerg. Sel. Topics Circuits and Syst., vol. 1, No. 4, pp. 526-535, Dec. 2011.

Yuan, Fang-Li, et al. "A throughput-agnostic 11.9-13.6 GOPS/mW multi-signal classification soc for cognitive radios in 40nm CMOS." VLSI Circuits (VLSI Circuits), 2015 Symposium on. IEEE, 2015.

Yuan, Fang-Li, Tsung-Han Yu, and Dejan Markovic. "A 500MHz blind classification processor for cognitive radios in 40nm CMOS." VLSI Circuits Digest of Technical Papers, 2014 Symposium on. IEEE, 2014.

* cited by examiner

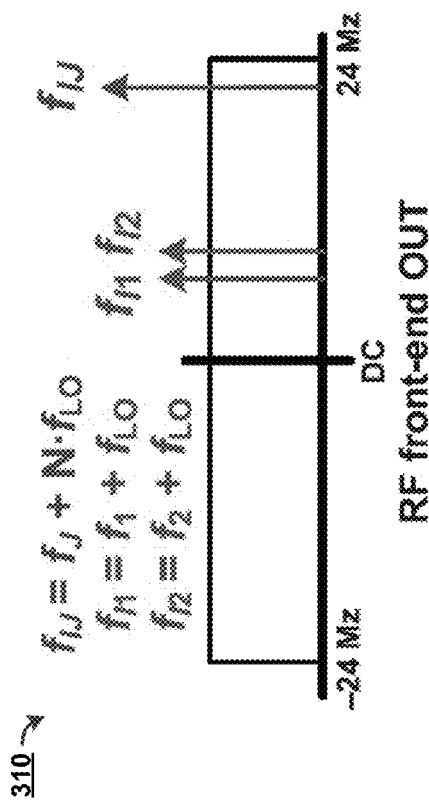
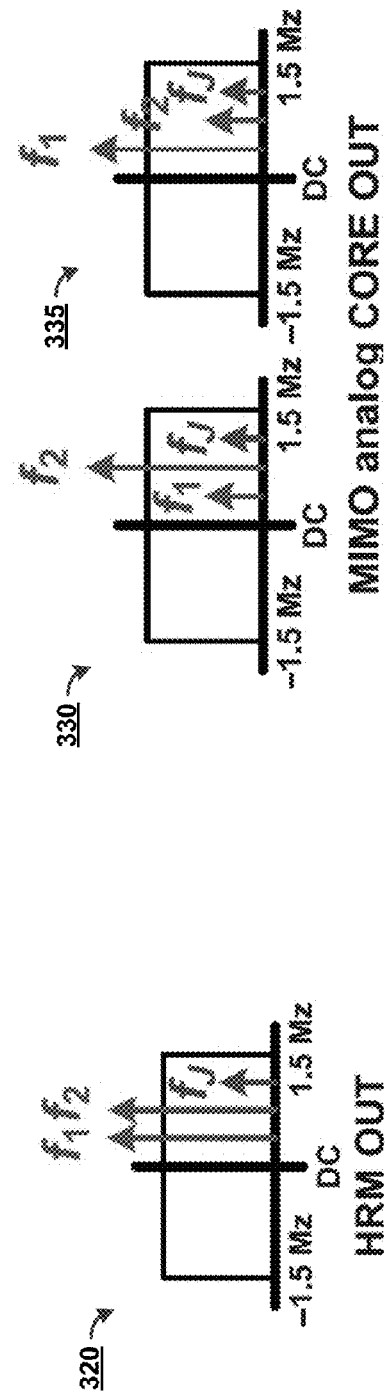
FIG. 3A
FIG. 3B
FIG. 3C

CAPACITIVE PASSIVE MIXER BASEBAND RECEIVER WITH BROADBAND HARMONIC REJECTION

CROSS REFERENCE TO RELATED APPLICATIONS

This application claims the benefit under 35 U.S.C. §119 to U.S. Provisional Application No. 62/222,126, filed on Sep. 22, 2015, and entitled CAPACITIVE PASSIVE MIXER BASEBAND RECEIVER WITH BROADBAND, the disclosure of which is incorporated herein by reference.

STATEMENT OF GOVERNMENT SPONSORED SUPPORT

This invention was made with government support under N66001-11-C-4159, awarded by DARPA. The government has certain rights in the invention.

TECHNICAL FIELD

The subject matter disclosed herein relates to generally to wireless communications, and more specifically to capacitive passive mixer baseband receivers with broadband harmonic rejection.

BACKGROUND

Broadband receivers for applications such as TV band tuners, multi-band cellular, cognitive radio, and/or software defined radio often employ a passive mixer harmonic rejection downconverter for high linearity and harmonic folding rejection. Conventionally, a multi-phase passive mixer with either transconductance or resistive weighting can be employed to approximate a synthetic sinusoidal downconverting clock. Such conventional harmonic rejection mixer (HRM) designs can suffer from device and resistive noise limiting receiver sensitivity, as well as nonlinear distortion due to voltage-dependent transconductance or switch resistance, and finite input impedance of transimpedance amplifiers. Noise cancelling schemes compensate partially for the heightened noise levels due to resistive passive mixing, but can require greater circuit complexity, and thereby take up more space. Furthermore, the HRM designs often operate at relatively high power consumption levels and can limit their use for mobile applications operating under stringent battery size and weight constraints.

SUMMARY

In one aspect, there is provided an apparatus. The apparatus may include a capacitive harmonic rejection mixer in which is configured to receive an input signal and generate, based on the input signal, an in-phase portion and a quadrature phase portion. The apparatus further includes a harmonic rejection mixer comprising a plurality of capacitors which are encoded with a plurality of predetermined capacitance values. The harmonic rejection mixer is configured to reduce harmonics in the input signal, based on applying a quantity of the plurality of predetermined capacitance values to the input signal. The apparatus further includes a plurality of switches configured to activate the plurality of capacitors. The quantity of the plurality of predetermined capacitance values applied to the input signal is based on a quantity of the plurality of capacitors that are active.

In some variations, one or more features disclosed herein including the following features can optionally be included in any feasible combination. The apparatus can further include a multi-phase local oscillator clock, and the plurality of switches can activate the plurality of capacitors based on signals from the multi-phase local oscillator clock. In related aspects, the plurality of switches can be sequentially opened or closed based on the signals from the multi-phase local oscillator clock. In some embodiments, the predetermined capacitance values can be based upon a capacitance of a corresponding capacitor from the plurality of capacitors, and/or at least a portion of the plurality of capacitors can have different predetermined capacitance values.

In various embodiments, the plurality of capacitors can include a first set of capacitors and a second set of capacitors. The first set of capacitors can be configured to generate a cosine waveform based on the in-phase portion, and/or the second set of capacitors can be configured to generate a sine waveform based on the quadrature phase portion. The harmonic rejection mixer can be configured to combine the cosine waveform and the sine waveform to provide a weighted signal based on the input signal, for example. The weighted signal can comprise a signal that is downconverted from the received input signal, and/or generating the weighted signal can reduce a strength of an undesired signal present in the input signal. In some embodiments, the harmonic rejection mixer can further include a first amplifier configured to amplify the combined cosine waveform and sine waveform. Additionally or alternatively, the apparatus can further include a multiple input multiple output analog core configured to separate a first signal from the input signal and a second signal from the input signal.

Implementations of the current subject matter can include, but are not limited to, systems and methods consistent including one or more features are described as well as articles that comprise a tangibly embodied machine-readable medium operable to cause one or more machines (e.g., computers, etc.) to result in operations described herein. Similarly, computer systems are also described that may include one or more processors and one or more memories coupled to the one or more processors. A memory, which can include a computer-readable storage medium, may include, encode, store, or the like one or more programs that cause one or more processors to perform one or more of the operations described herein. Computer implemented methods consistent with one or more implementations of the current subject matter can be implemented by one or more data processors residing in a single computing system or multiple computing systems. Such multiple computing systems can be connected and can exchange data and/or commands or other instructions or the like via one or more connections, including but not limited to a connection over a network (e.g. the Internet, a wireless wide area network, a local area network, a wide area network, a wired network, or the like), via a direct connection between one or more of the multiple computing systems, etc.

The details of one or more variations of the subject matter described herein are set forth in the accompanying drawings and the description below. Other features and advantages of the subject matter described herein will be apparent from the description and drawings, and from the claims. While certain features of the currently disclosed subject matter are described for illustrative purposes in relation to an enterprise resource software system or other business software solution or architecture, it should be readily understood that such features are not intended to be limiting. The claims that follow this disclosure are intended to define the scope of the protected subject matter.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the disclosed implementations. In the drawings.

FIG. 3A illustrates an example output of the RF front-end of FIG. 2;

FIG. 3B illustrates an example output of the capacitive HRM of FIG. 2;

FIG. 3C illustrates example outputs of the MIMO analog core of FIG. 2;

DETAILED DESCRIPTION

As noted above, broadband receivers with conventional harmonic rejection mixer (HRM) designs can suffer from device and resistive noise, limiting receiver sensitivity, as well as nonlinear distortion due to voltage-dependent transconductance or switch resistance, and finite input impedance of transimpedance amplifiers. As also highlighted above, HRM designs can generally operate at relatively high power consumption levels, limiting their use for mobile applications. As such, systems, apparatus, and methods for HRM designs which provide for greater filtering and/or utilize less power are provided herein.

Figure 1:
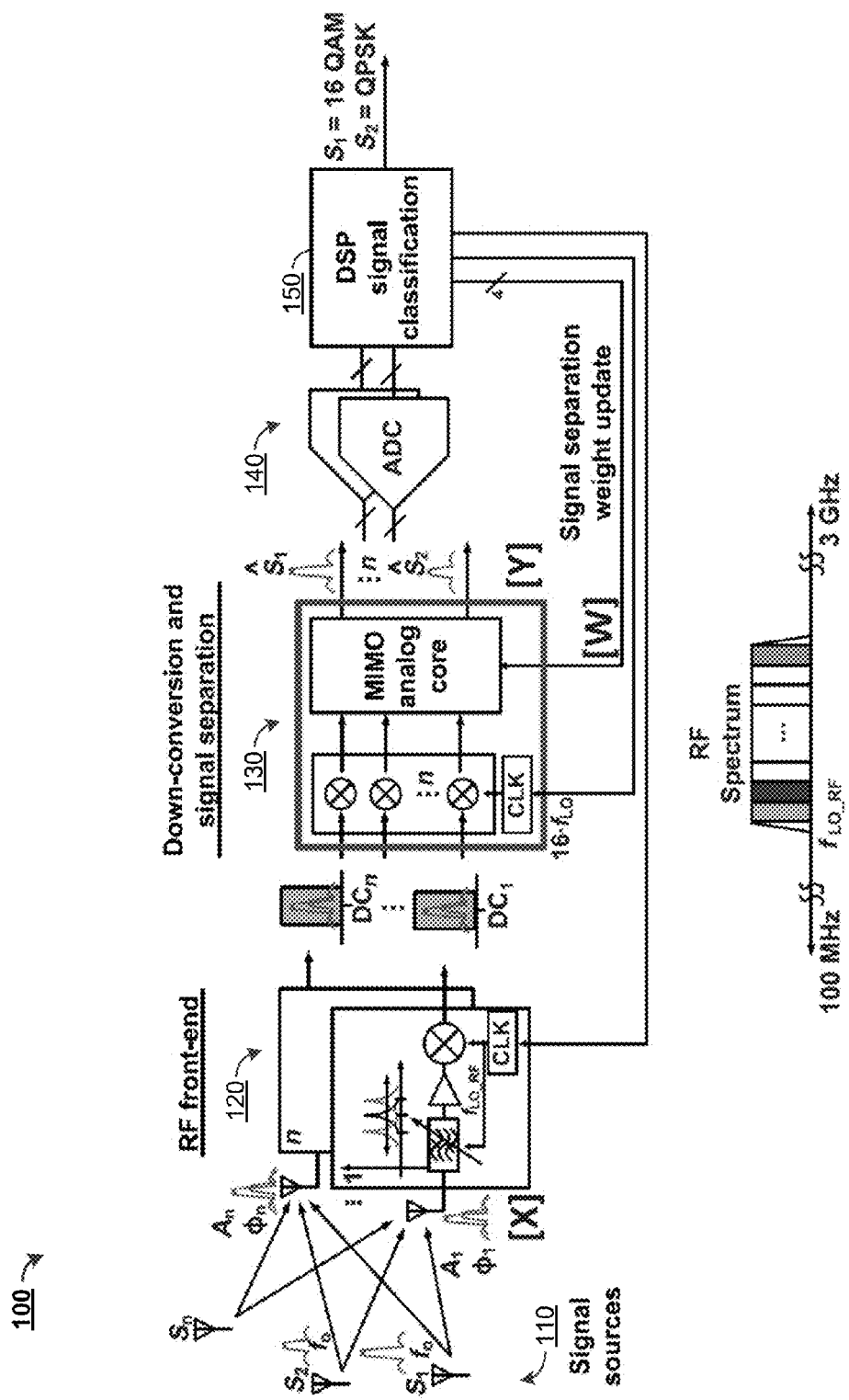
FIG. 1 illustrates an example of a system in which capacitive HRMs and/or MIMO analog cores may be implemented, in accordance with some embodiments.

FIG. 1 illustrates an example of a system 100 in which capacitive HRMs and/or multiple-input multiple-output (MIMO) analog cores may be implemented, in accordance with some embodiments. As illustrated, the system 100 can include multiple signal sources 110 which provide radio frequency (RF) signals $S_1$, $S_2$, $S_n$. As illustrated, the RF spectrum can include a range from 100 MHz to 3 GHz. In many aspects, these RF signals can be used for wireless communication. In various implementations, the signal sources 110 can include one or more of a base station (BS), a mobile station (STA), and/or the like.

As illustrated, RF signals may be received through the use of an RF front-end 120. In various implementations, the RF front-end 120 can include an array of receivers, transmitters, transceivers, and/or the like, each with an associated antenna $A_{1-n}$. As further illustrated, the outputs (e.g., in the form of the illustrated signals $DC_1$-$DC_N$) of the RF front-end can be provided to a down-conversion and signal separation circuit 130. In turn, the down-conversion and signal separation circuit 130 can down-convert the input, remove unwanted signals from the input, separate/isolate one or more of the signals from the input, and/or provide the separated signals as outputs (e.g., the illustrated signals $S_1$ and $S_2$).

As further illustrated, the separated signals $S_1$, $S_2$ can be further processed by one or more analog-to-digital converter (ADC) 140 and/or a digital signal processor (DSP) signal classification circuit 150. In some aspects, signal $S_1$ can be a quadrature amplitude modulation (QAM) signal (e.g., 16-QAM) and/or signal $S_2$ can be a quadrature phase-shift keying (QPSK) signal. Additionally or alternatively, signals of other modulation types may be present. The proper reception and separation of multiple signals can allow for more signal sources 110 to be present within a given location without significantly affecting the quality of each other. Similarly, the proper reception and separation of multiple signals of different modulation types can allow for signal sources 110 using different communication technologies to be present within a given location without significantly affecting the quality of each other.

Figure 2:
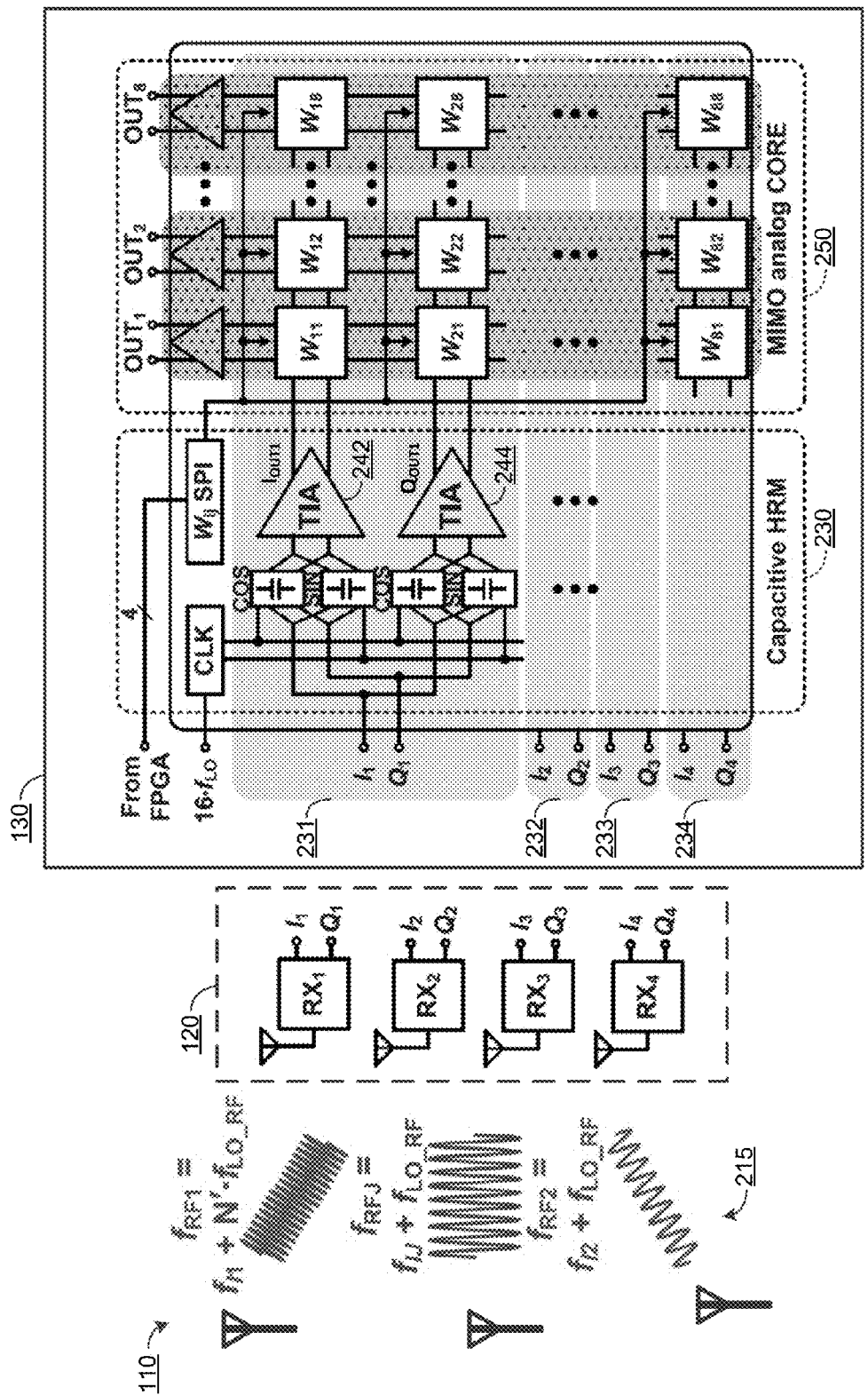
FIG. 2 illustrates an example of the RF front-end, along with the down-conversion and signal separation circuit of FIG. 1, in accordance with some embodiments.

FIG. 2 illustrates an example of the RF front-end 120 and down-conversion and signal separation circuit 130 of FIG. 1, in accordance with some embodiments. As illustrated, the RF front-end 120 can include four receivers $RX_1$-$RX_4$ with associated antennas, configured to receive RF signals 215 from the signal sources 110. In some aspects, at least a portion of the receivers $RX_1$-$RX_4$ can be regarded as a baseband receiver. As illustrated, the RF signals 215 can include a first signal $f_1$, a second signal $f_2$, and jammer signal $f_J$. Each of the receivers $RX_1$-$RX_4$ may output an in-phase signal $I_{1-4}$ and quadrature phase signal $Q_{1-4}$ based on the received RF signals 215. For example, FIG. 3A illustrates an example output 310 of the RF front-end 120 of FIG. 2. As illustrated, the output 310 can contain the first signal $f_1$, the second signal $f_2$, and the jammer signal $f_J$, where the jammer signal $f_J$ is stronger than the first signal $f_1$ and the second signal $f_2$. However, the jammer signal $f_J$ may not be desirable, but one or both of the first signal $f_1$ and the second signal $f_2$ may be desirable. Thus, the down-conversion and signal separation circuit 130 may be utilized to achieve this. As further illustrated, the bandwidth of the output 310 can be 48 MHz (−24 MHz to 24 MHz).

Referring back to FIG. 2, portions of capacitive sub-circuits 231-234 may form a portion of a capacitive HRM 230. In some aspects, the capacitive HRM 230 may further include a clock CLK and/or a serial peripheral interface SPI. In various embodiments, the capacitive HRM 230 can be a charge-based HRM. As illustrated, the outputs of the receivers $RX_1$-$RX_4$ can be provided as inputs to the capacitive HRM 230 of the down-conversion and signal separation circuit 130. Specifically, the outputs of $RX_1$ ($I_1$ and $Q_1$) can be provided as inputs to a first capacitive sub-circuit 231, the outputs of $RX_2$ ($I_2$ and $Q_2$) can be provided as inputs to a second capacitive sub-circuit 232, the outputs of $RX_3$ ($I_3$ and $Q_3$) can be provided as inputs to a third capacitive sub-circuit 233, and the outputs of $RX_4$ ($I_4$ and $Q_4$) can be provided as inputs to a fourth capacitive sub-circuit 234. Although not illustrated, second, third, and fourth capacitive sub-circuits 232-234 may be similar in design and/or function to the first capacitive sub-circuit 231.

The capacitive sub-circuits 231-234 can be regarded as separate circuits, and may only be referred to as "sub-circuits" based on their placement among a combination of circuits that form some larger circuit (e.g., the down-conversion and signal separation circuit 130). Similarly, the capacitive sub-circuits 231-234 can include more than just capacitors, and may only be referred to as "capacitive" based on their inclusion of multiple capacitors. For example, as illustrated, the first capacitive sub-circuit 231 includes the amplifiers 242, 244, which provide output(s) of the capacitive HRM 230 to the MIMO analog core 250, as described herein. In some aspects, one or more of the amplifiers 242, 244 can include a transimpedance amplifier (TIA).

Based upon the outputs of $RX_{1-4}$, the capacitive sub-circuits 231-234 may reduce/remove the jammer signal $f_J$. For example, in some embodiments, $I_1$ and $Q_J$ may be provided as inputs to sine (illustrated as "SIN") and cosine (illustrated as "COS") circuits, outputs of the sine and cosine circuits may be provided as inputs to the amplifiers 242, 244, and outputs of the amplifiers 242, 244 (illustrated as "$I_{OUT1}$" and "$Q_{OUT1}$") can be part of the outputs of the capacitive HRM 230. FIG. 3B illustrates an example output 320 of the capacitive HRM 230 of FIG. 2. As illustrated, the output 320 can still include the first signal $f_1$, the second signal $f_2$, and the jammer signal $f_J$, but the jammer signal $f_J$ is now weaker than the first signal $f_1$ and the second signal $f_2$. As further illustrated, the bandwidth of the output 320 can be reduced to 3 MHz (−1.5 MHz to 1.5 MHz).

Referring back to FIG. 2, outputs of the capacitive HRM 230 can be provided as inputs to the MIMO analog core 250. As illustrated, portions of the capacitive sub-circuits 231-234 may form at least a portion of the MIMO analog core 250. In some embodiments, separate capacitive sub-circuits may be used for the capacitive HRM 230 and/or the MIMO analog core 250. In various embodiments, the MIMO analog core 250 includes 2N amplifiers and $4N^2$ capacitors, where N corresponds to the number of receivers used/present (e.g., the four illustrated receivers $RX_{1-4}$).

The MIMO analog core 250 can be configured to modify the input in order to output desired signals separately. For example, the capacitors $W_{11}$ through $W_{18}$ can be configured to receive $I_{OUT1}$, capacitors $W_{21}$ through $W_{28}$ can be configured to receive $Q_{OUT1}$, and so on. In turn, capacitors $W_{11}$ through $W_{81}$ may be configured to provide an output to a first amplifier which outputs $OUT_1$, capacitors $W_{12}$ through $W_{82}$ may be configured to provide an output to a second amplifier which outputs $OUT_2$, and so on. These outputs $OUT_{1-8}$ of the MIMO analog core 250 can contain one or more of the separated signals (e.g., signals $f_1$ and/or $f_2$). Although the term separated is used, undesired signals may still be present within the outputs, but the undesired signals might not be as strong as the desired signals. In some aspects, the MIMO analog core 250 can perform spatial filtering such that it rejects in-band jammer and/or separates completely spectral overlapped signals. Unlike a conventional spectral filter, the MIMO analog core 250 need not rely on spectrum.

FIG. 3C illustrates example outputs 330, 335 of the MIMO analog core 250 of FIG. 2. As illustrated, the output 330 can include the first signal $f_1$, the second signal $f_2$, and the jammer signal $f_J$, but the second signal $f_2$ is stronger than either of the first signal $f_1$ or the jammer signal $f_J$. Similarly, the output 335 can include the first signal $f_1$, the second signal $f_2$, and the jammer signal $f_J$, but the first signal $f_1$ is stronger than either of the second signal $f_2$ or the jammer signal $f_J$. As further illustrated, the bandwidth of either of the outputs 330, 335 can be 3 MHz (−1.5 MHz to 1.5 MHz).

Although many of the circuits described herein are illustrated as having a specific structure, layout, relative position to other circuits, etc., in various implementations, one or more of these aspects can be altered without departing from the spirit of the invention. For example, although the capacitive HRM 230 and MIMO analog core 250 are illustrated as part of the down-conversion and signal separation circuit 130, in some implementations, only one might be present, each may form a portion of two separate circuits, at least a portion of each may be combined, the order of these components can be different, and/or the like.

Figure 4A:
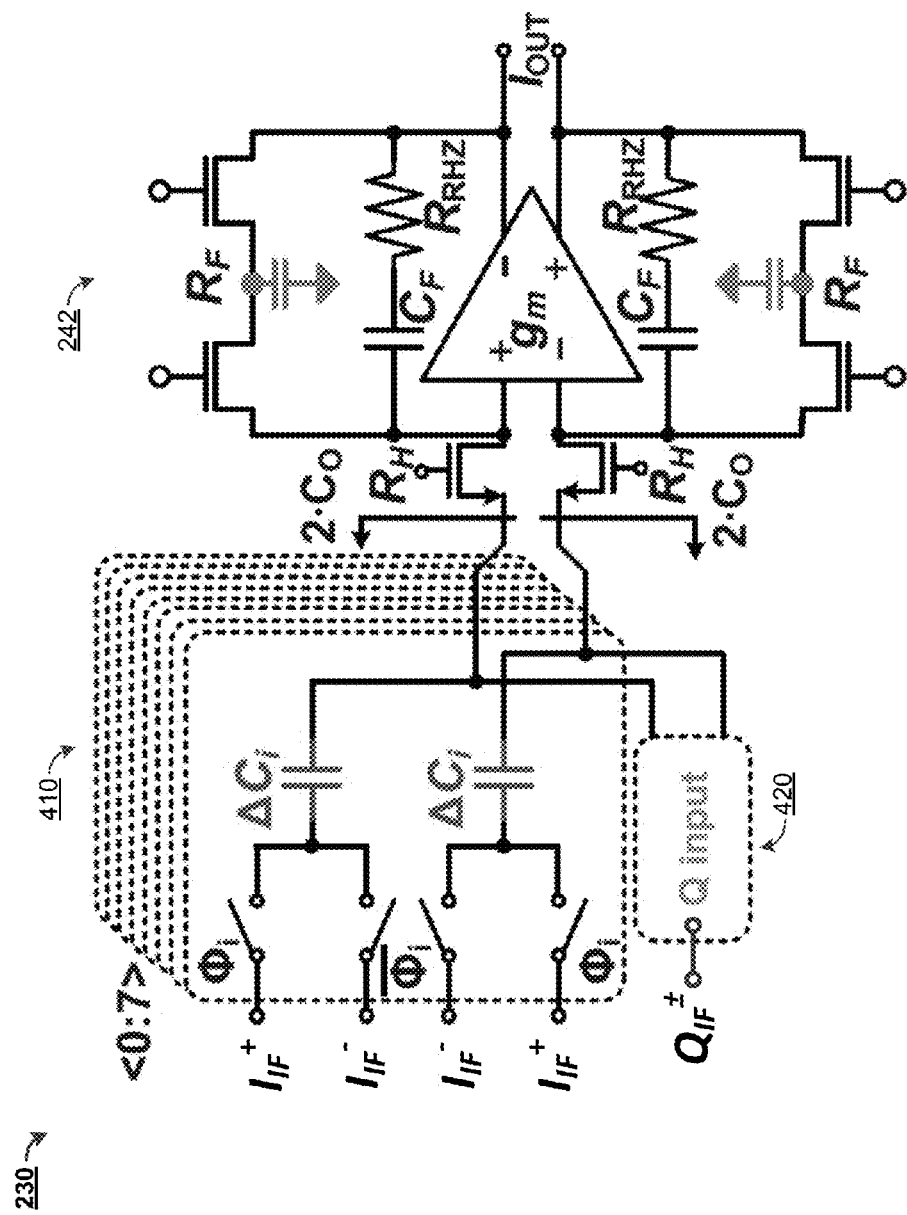
FIG. 4A illustrates an example of a portion of the capacitive HRM of FIG. 1, in accordance with some embodiments.

FIG. 4A illustrates an example of a portion of the capacitive HRM 230 of FIG. 1, in accordance with some embodiments. As illustrated, the capacitive HRM 230 can include at least a first capacitor array 410, a second capacitor array 420, and the first amplifier 242. The first capacitor array 410 can include eight capacitor circuits, indexed <0:7> and denoted by 'i'. In some aspects, the first capacitor array 410 can be switched by one or more multi-phase local oscillator (LO) clock signals.

As illustrated, each capacitor circuit in the first capacitor array 410 can include upper input which receives $I_{IF+}$ and is gated based on $\Phi i$, an upper input which receives $I_{IF-}$ and is gated by $\overline{\Phi}i$, a lower input which receives $I_{IF-}$ and is gated by $\overline{\Phi}i$, and a lower input which receives $I_{IF+}$ and is gated by $\Phi i$. In some aspects, $I_{IF+}$ and $I_{IF-}$ can refer to differential inputs based on the in-phase intermediate frequency. Depending upon whether $\Phi i$ is high or low, the corresponding capacitor(s) $\Delta Ci$ may be used to provide a certain level of capacitive weight on the input signal (e.g., signal $I_1$ from the first receiver $RX_1$). In some embodiments, the capacitive weight of the capacitor $\Delta Ci$ can be the same for each of the capacitor circuits in the first capacitor array 410, different for all of the capacitor circuits, or different for only a portion of the capacitor circuits.

For example in some embodiments, the first capacitor circuit in the first capacitor array 410 can be configured to have 4 pF of capacitance (e.g., $\Delta C_0$=4 pF), the second can be configured to have 11 pF (e.g., $\Delta C_1$=11 pF), the third can be configured to have 16.5 pF (e.g., $\Delta C_2$=16.5 pF), the fourth can be configured to have 19.5 pF (e.g., $\Delta C_3$=19.5 pF), the fifth can be configured to have 19.5 pF (e.g., $\Delta C_4$=19.5 pF), the sixth can be configured to have 16.5 pF (e.g., $\Delta C_5$=16.5 pF), the seventh can be configured to have 11 pF (e.g., $\Delta C_6$=11 pF), and/or the eighth can be configured to have 4 pF (e.g., $\Delta C_7$=4 pF).

Based upon which (if any) of the capacitors are active, the corresponding capacitive weight(s) of the active capacitors may be summed up. This summed up weight can be added or subtracted to at least a portion of the in-phase signal and/or quadrature phase signal. In various embodiments, the weights applied to the in-phase signal are independent of the weights applied to the quadrature phase signal. Doing so can provide for a downconversion of an input signal, a reduction of harmonics, and/or a reduction of a jammer signal (e.g., $f_J$) and/or another undesired signal present within the input signal. The summation of different capacitive weights can be referred to herein as "deferential capacitance." Deferential capacitance can reduce the number and/or size of capacitors necessary to achieve a specific level of capacitance. For example, instead of using a 0 pF capacitor, a 4 pF capacitor, a larger 15 pF capacitor, a larger 31.5 pF capacitor, a larger 51 pF capacitor, a larger 70.5 pF capacitor, a larger 87 pF capacitor, a larger 98 pF capacitor, and a larger 102 pF capacitor, in various embodiments, only eight capacitors of 19.5 pF or less are required. In some aspects, the capacitance/weights can be thermo-coded.

In various embodiments, the capacitors in the capacitor array 410 can implement harmonic mixing of the signal with the sinusoidal weights. For example, the outputs of the capacitor circuits in the first capacitor array 410 can be used to provide a cosine waveform signal. In some embodiments, the cosine waveform can be generated through 16-phase sinusoidal weight modulation. In some aspects, using the specified capacitance values can allow for smooth transitions in the generation of the cosine waveform. In some aspects, the use of differential capacitance can decrease design complexity, reduce the size of circuits containing the capacitive HRM 230, allow for passive designs, and/or the like.

Since the weights can be implemented by capacitance sizing, thermal noise may be reduced, and linearity may be improved over implementations employing transconductance or resistive weighting. As the down-conversion is charge based, the device size of the down-conversion passive mixer may also be reduced, and/or the input impedance requirements of the amplifier 242 can be relaxed, reducing baseband receiver power consumption.

Although only the structure of the first capacitor is illustrated, the remaining seven capacitors may have a similar (or the same) structure. Although the first capacitor array 410 is illustrated as containing eight capacitors, in various embodiments, more or less capacitors may be present. The same may be true of the other capacitor arrays.

Figure 4B:
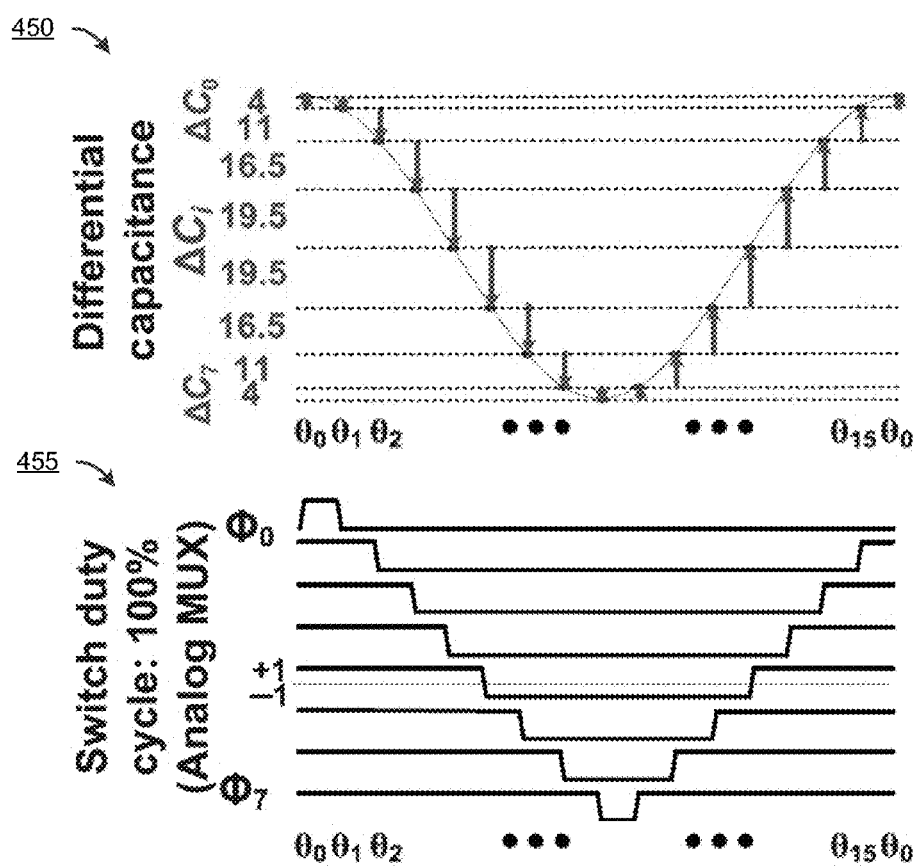
FIG. 4B illustrates an example timing diagram of the cosine waveform generated by the first capacitor array of FIG. 4A along with a corresponding switch duty cycle diagram, in accordance with some embodiments.

FIG. 4B illustrates an example timing diagram 450 of the cosine waveform generated by the first capacitor array 410 of FIG. 4A, in accordance with some embodiments. As illustrated, the cosine waveform can span time intervals $\theta_0$ through $\theta_{15}$. In some aspects, once time interval $\theta_{15}$ is reached, time interval $\theta_0$ repeats again (e.g., time intervals $\theta_0$ through $\theta_{15}$ are continuously repeated over time to form the cosine waveform). At each time interval, more or less capacitance may be provided, such that the strength of the cosine waveform may increase or decrease. In some aspects, doing so may allow for the formation of the cosine waveform. Although sixteen time intervals are illustrated, more or less time intervals may be used in other embodiments.

In some embodiments, the capacitance can be controlled based on whether each $\Phi i$ is high or low, as illustrated in the corresponding switch duty cycle diagram 455. For example, at time interval $\theta_0$, all of $\Phi_{0-7}$ can be high, and the total capacitance can be 102 pF (or some offset +102 pF). At time interval $\theta_1$, $\Phi_0$ can be low, and $\Phi_{1-7}$ can be high, making the total capacitance 98 pF (or some offset +98 pF). As illustrated, at time interval $\theta_2$, the total capacitance can decrease an additional 16.5 pF; at time interval $\theta_3$, the total capacitance can decrease an additional 19.5 pF; at time interval $\theta_4$, the total capacitance can decrease an additional 19.5 pF; at time interval $\theta_5$, the total capacitance can decrease an additional 16.5 pF; at time interval $\theta_6$, the total capacitance can decrease an additional 11 pF; and at time interval $\theta_7$, the total capacitance can decrease an additional 4 pF, reaching a total capacitance of 0 pF (or some offset +0 pF). Thereafter, from at time intervals $\theta_8$ through $\theta_{15}$, the total capacitance can increase in reverse order (reverse of $\theta_0$ though $\theta_7$), until returning to 102 pF again (or some offset +102 pF). In some aspects, the capacitance offset can be used for all segments of the cosine waveform. The corresponding decreases in capacitance can correspond to sequentially changing one of $\Phi_{0-7}$ from high to low, and/or the corresponding increases in capacitance can correspond to sequentially changing one of $\Phi_{0-7}$ (e.g., in reverse order) from low to high.

Referring back to FIG. 4A, the cosine waveform signal generated by the first capacitor array 410 can be provided as an input to the amplifier 242. Although not illustrated in detail, the design and/or function of the second capacitor array 420 can be similar to the first capacitor array 410. However, the second capacitor array 420 can be configured to receive quadrature phase ("Q") inputs instead, and/or may be configured to generate the sine waveform instead of a cosine waveform. The sine waveform signal generated by the second capacitor array 420 can be provided as another input to the amplifier 242. In some aspects, the cosine waveform of the first capacitor array 410 can be combined with the sine waveform of the second capacitor array 420, before being provided as inputs to the amplifier 242. This combination can include passive mixing of cosine and sine weighted capacitors, resulting in a downconverted signal. In some aspects, a downconverted signal can allow the capacitive HRM 230 to handle higher harmonic power. Based upon the downconverted signal, the amplifier 242 can be configured to provide $I_{OUT}$ (e.g., $I_{OUT1}$ of FIG. 2). In some aspects, downconverting an input signal before amplifying the signal can be advantageous over systems which amplify an input signal before applying sinusoidal weighting, as an undesired signal (e.g., the jammer signal $f_J$) in these systems may be amplified before it is rejected, which can lead to receiver saturation and/or other undesired results. For example, at a high input power, transconductance can be changed from an intended value, downgrading HRM performance.

In some aspects, the capacitive HRM 230 can additionally or alternatively include a third capacitor array (similar to the first capacitor array 410) which generates a cosine waveform based upon Q inputs (e.g., $Q_1$ of FIG. 2), and/or a fourth capacitor array (similar to the second capacitor array 420) which generates a sine waveform based upon I inputs (e.g., $I_1$ of FIG. 2). The Q-based cosine waveform can be provided as an input to the amplifier 244 of FIG. 2, and the I-based sine waveform can be provided as another input to the amplifier 244. In some aspects, the cosine waveform of the third capacitor array can be combined with the sine waveform of the fourth capacitor array before they are provided as inputs to the amplifier 244. Based upon these inputs, the amplifier 244 can output $Q_{OUT}$ (e.g., $Q_{OUT1}$ of FIG. 2). As discussed above, the outputs $I_{OUT}$, $Q_{OUT}$ of the amplifiers 242, 244 can include reduced-strength undesired signals, higher strength desired signals, and/or can be provided as inputs to the MIMO analog core 250 to separate the desired signals.

Figure 5A:
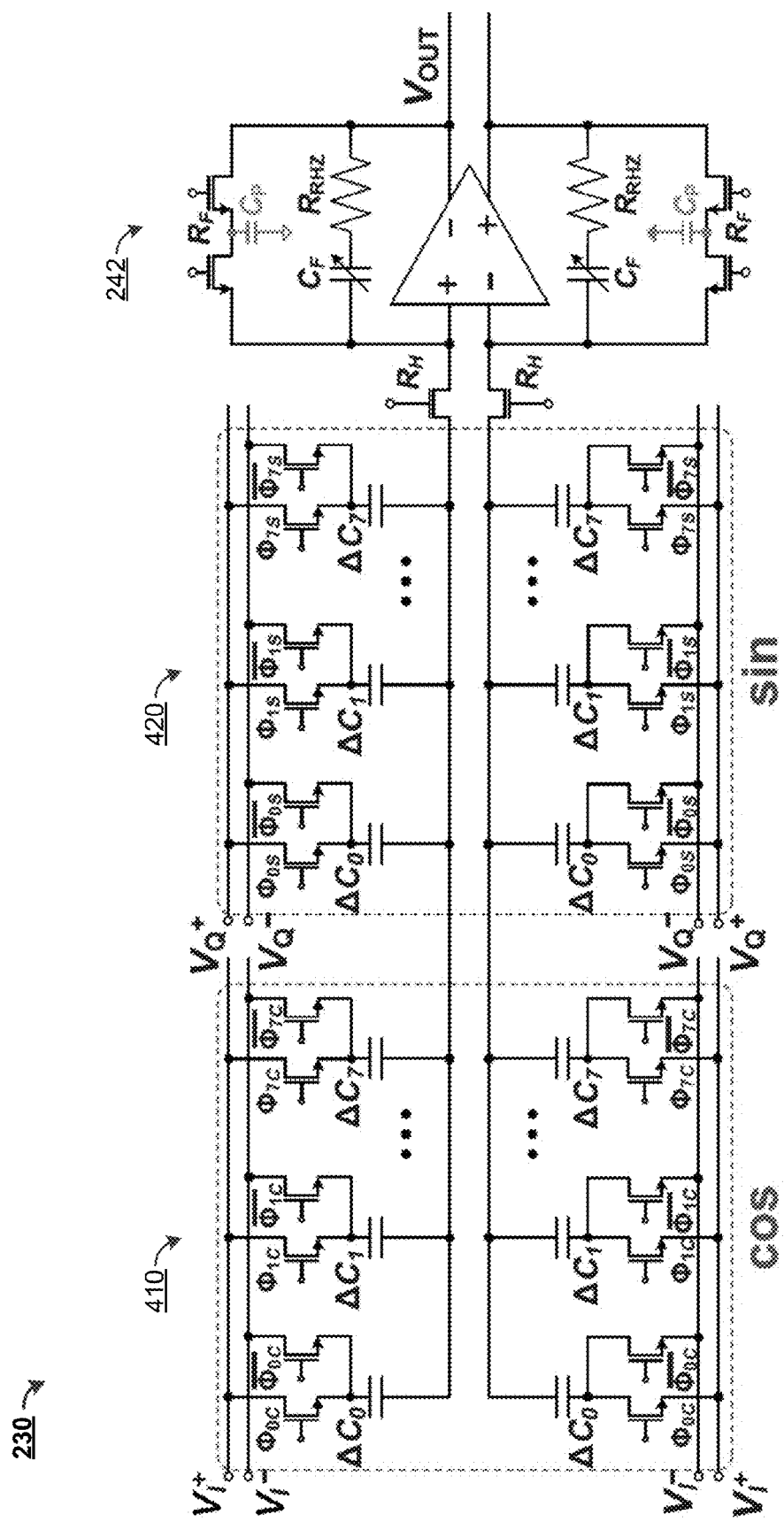
FIG. 5A illustrates another example of a portion of the capacitive HRM of FIG. 1, in accordance with some embodiments.

FIG. 5A illustrates another example of a portion of the capacitive HRM 230 of FIG. 1, in accordance with some embodiments. Specifically, the first capacitor array 410 is illustrated as including two rows of gated differential capacitors, each including capacitors $\Delta C_{0-7}$, which can be gated through corresponding gates controlled by $\Phi_{0C-7C}$ being high or low. Similarly, the second capacitor array 420 is illustrated as including two rows of gated differential capacitors, each including capacitors $\Delta C_{0-7}$, which can be gated through corresponding gates controlled by $\Phi_{0S-7S}$ being high or low. As illustrated, the first capacitor array 410 can be configured to receive I-based inputs and/or provide a cosine waveform to the second capacitor array 420. Similarly, the second capacitor array 420 can be configured to receive Q-based inputs, and/or generate a sine waveform. As illustrated, the cosine waveform generated by the first capacitor array 410 can be combined with the sine waveform generated by the second capacitor array 420, and the combined signals can be provided as inputs to the amplifier 242, which in turn generates $V_{OUT}$.

As illustrated, the first capacitor array 410 can be referred to as a cosine circuit, and/or the second capacitor array 420 can be referred to as a sine circuit. An additional, similar configuration of capacitors may be included within the capacitive HRM 230, but with the I and Q inputs switched (e.g., using Q inputs for a cosine circuit and using I inputs for a sine circuit). This additional configuration of capacitors may provide inputs to the amplifier 244 instead, which may, in turn, generate $Q_{OUT}$.

Figure 5B:
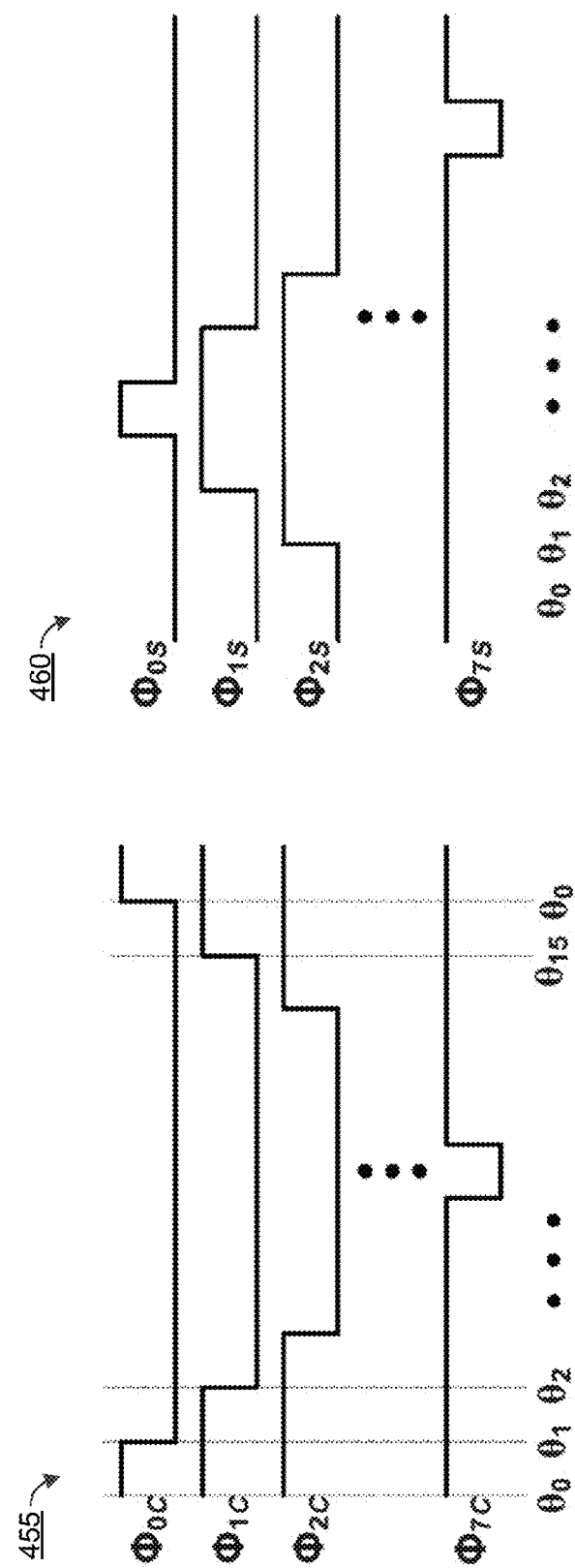
FIG. 5B illustrates another example timing diagram of the switching times for cosine and sine waveforms, in accordance with some embodiments.

FIG. 5B illustrates another example timing diagram 455 of the switching times for the cosine waveform, in accordance with some embodiments. Similarly, FIG. 5B also illustrates an example timing diagram 460 of the switching times for the sine waveform, in accordance with some embodiments. As illustrated, instead of $\Phi_{0C-7C}$, the timing diagram 460 illustrates when $\Phi_{0S-7S}$ may be high or low. These gates can operate similar to $\Phi_{0C-7C}$, but may be gated over the course of the time intervals in order to generate a sine waveform.

For example, at time interval $\theta_0$, $\Phi_{0-3}$ can be low, and $\Phi_{4-7}$ can be high, making the total capacitance 51 pF. At time interval $\theta_1$, $\Phi_3$ can be switched on, making the total capacitance increase an additional 19.5 pF; at time interval $\theta_2$, $\Phi_2$ can be switched on, making the total capacitance increase an additional 16.5 pF; at time interval $\theta_3$, $\Phi_1$ can be switched on, making the total capacitance increase an additional 11 pF; and/or at time interval $\theta_4$, $\Phi_0$ can be switched on, making the total capacitance increase an additional 4 pF (for a total of 102 pF). Thereafter, from at time intervals $\theta_5$ through $\theta_8$, the total capacitance can decrease in reverse order (reverse of $\theta_0$ though $\theta_4$) until returning to 51 pF again. Next, from at time intervals $\theta_9$ through $\theta_{12}$, the total capacitance can decrease in the same order (as $\theta_0$ though $\theta_4$) until reaching 0 pF. Thereafter, from at time intervals $\theta_{13}$ through $\theta_{15}$ and repeating $\theta_0$, the total capacitance can increase in reverse order (reverse of $\theta_9$ though $\theta_{12}$) until returning to 51 pF again.

Figure 6:
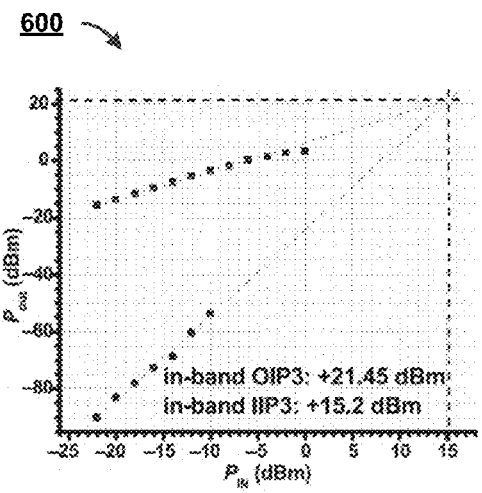
FIG. 6 illustrates a diagram of measured in-band, third-order input and output intercept points, in accordance with some embodiments.

FIG. 6 illustrates a diagram 600 of measured in-band, third-order input and output intercept points, in accordance with some embodiments. As illustrated, the input and output intercept points can be where the in-band IIP3 equals approximately +15.2 dBm and the in-band OIP3 equals approximately +21.45 dBm, respectively. Similar intercept points can exist for other harmonics (e.g., $2^{nd}$ order, any of $4^{th}$ through $14^{th}$ order, and/or $15^{th}$ order).

Figure 7:
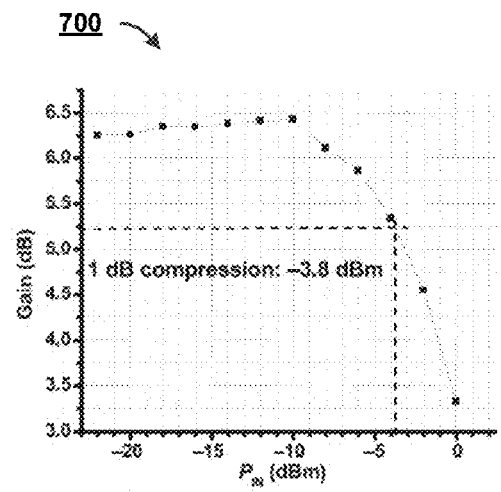
FIG. 7 illustrates a diagram of measured gain versus input power, in accordance with some embodiments.
Figure 8:
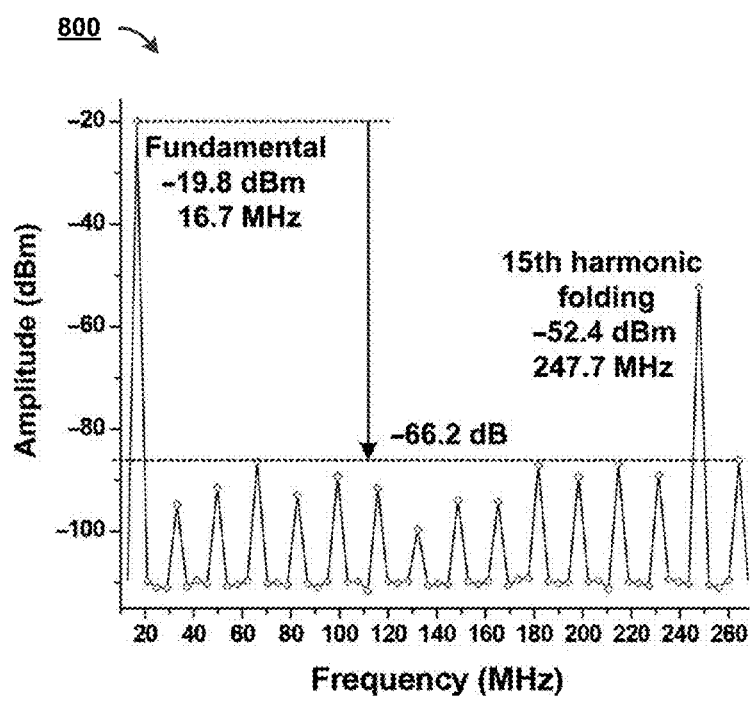
FIG. 8 illustrates a diagram of measured harmonic folding, in accordance with some embodiments.

FIG. 7 illustrates a diagram 700 of measured gain versus input power, in accordance with some embodiments. As illustrated, 1 dB compression (P1dB) can be provided at approximately −3.8 dBm. In some aspects, this can allow for higher output power. FIG. 8 illustrates a diagram 800 of measured harmonic folding, in accordance with some embodiments. As illustrated, the fundamental frequency can be at approximately −19.8 dBm with a frequency of approximately 16.7 MHz. As also illustrated, through the use of the systems/methods described herein, harmonic folding can occur up to the $16^{th}$ harmonic of the local oscillator (LO). For example, the $2^{nd}$ through the $14^{th}$, as well as the $16^{th}$ harmonic can be reduced to below approximately −66.2 dB. However, folding of the $15^{th}$ harmonic may not result from the used of the capacitive HRM, and/or an additional technique can be used to fold the $15^{th}$ harmonic. In some aspects, the $f_{LO}$ can be set to 16.5 MHz, with an input frequency from 16.7 to 264.2 MHz.

Figure 9:
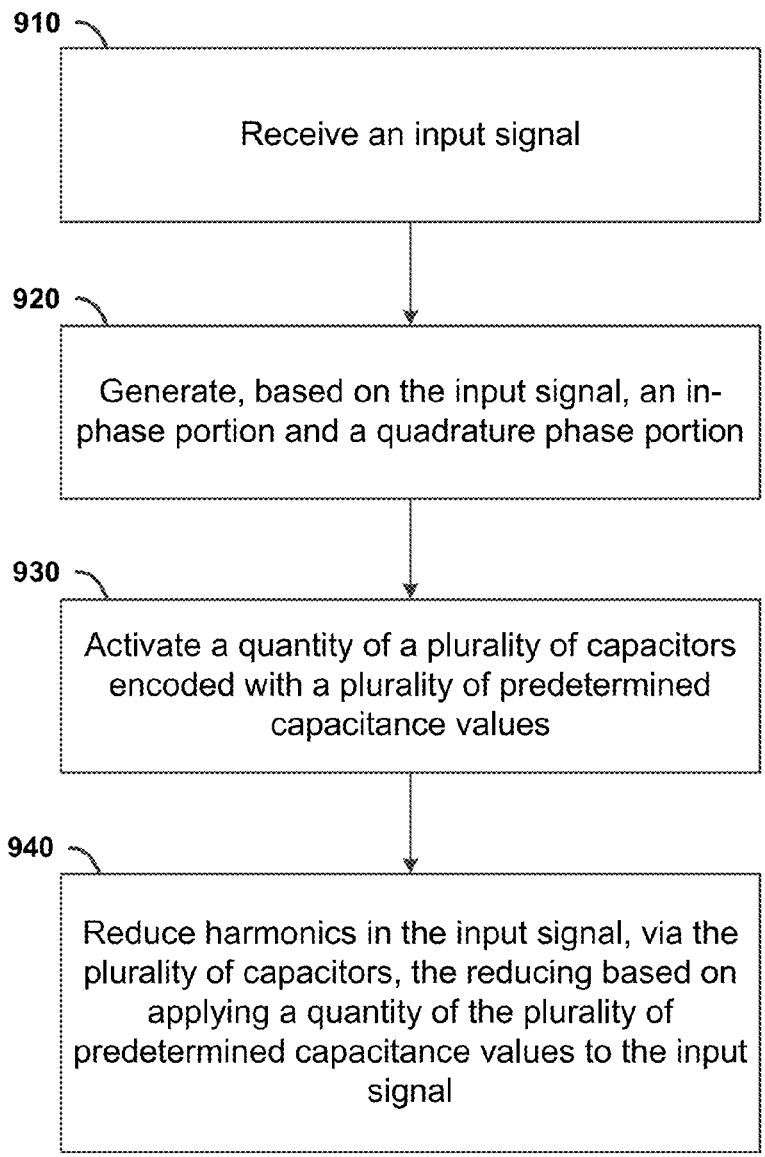
FIG. 9 illustrates an example of a method for harmonic mixing, in accordance with various embodiments.

FIG. 9 illustrates an example of a method 900 for harmonic mixing, in accordance with various embodiments. Although method 900 is illustrated as having a specific operational flow, two or more steps may be combined into a single step, a single step may be performed in one or more steps, one or more of the illustrated steps may not be present in various implementations, and/or additional steps not illustrated may be part of the method 900. In various embodiments, the method 900 may be performed by the system 100 and/or portions thereof, such as one or more of the RF front-end 120, the down-conversion and signal separation circuit 130, the capacitive HRM 230, the first amplifier 242, the second amplifier 244, the MIMO analog core 250, the first capacitor array 410, the second capacitor array 420, the third and/or fourth capacitor arrays (not illustrated), portions thereof, and/or their equivalents.

Method 900 may start at operational block 910 where the system 100, for example, receives an input signal. In some aspects, the RF front end 120 may be used to receive the input signal.

Method 900 may next proceed to operational block 920 where the system 100, for example, generates an in-phase portion and a quadrature phase portion based on the input signal. In some aspects, the RF front end 120 may be used to generate the in-phase portion and the quadrature phase portion. In turn, the in-phase portion and/or the quadrature phase portion can be provided to the capacitive HRM 230.

Method 900 may next proceed to operational block 930 where the system 100, for example, activates a quantity of a plurality of capacitors encoded with a plurality of predetermined capacitance values. In some aspects, the quantity of activated capacitors can be zero or any positive integer. In some aspects, the capacitors can be activated via a plurality of switches. These switches can be controlled via signals from a multi-phase local oscillator clock. In some aspects, the plurality of switches can be sequentially opened or closed based on the signals from the multi-phase local oscillator clock. Sequentially can refer to a location of the capacitors relative to each other (e.g., as in FIG. 5A). In various embodiments, the predetermined capacitance values are based upon a capacitance of a corresponding capacitor from the plurality of capacitors. At least a portion of the plurality of capacitors can have different predetermined capacitance values. For example, one or more of the capacitors can have a predetermined capacitance value of 4 pF, 11 pF, 16.5 pF, 19.5 pF, or some other value. In some aspects, the predetermined capacitance values can be referred to as sinusoidal weights.

Method 900 may next proceed to operational block 930 where the system 100, for example, reduces harmonics in the input signal, via the plurality of capacitors, the reducing based on applying a quantity of the plurality of predetermined capacitance values to the input signal. In some aspects, the reduction of harmonics can be performed by the capacitive HRM 230, which can include the plurality of capacitors.

In some embodiments, the plurality of capacitors includes a first set of capacitors and a second set of capacitors. The first set of capacitors can be configured to generate a cosine waveform based on the in-phase portion and/or the second set of capacitors can be configured to generate a sine waveform based on the quadrature phase portion. The harmonic rejection mixer can includes the plurality of capacitors can be configured to combine the cosine waveform and the sine waveform. Combining the cosine waveform and the sine waveform can provide a weighted signal based on the input signal, where the weighted signal comprises a signal that is downconverted from the received input signal. Generating the weighted signal can reduce a strength of an undesired signal present in the input signal.

Additionally or alternatively, the method 900 can include the system 100, for example, amplifying the combined cosine waveform and sine waveform. In some aspects, the amplification can be performed via a first amplifier of the harmonic rejection mixer. Additionally or alternatively, the method 900 can include the system 100, for example, separating a first signal from the input signal and a second signal from the input signal. The separating can be performed via a multiple input multiple output analog core.

In some embodiments, the plurality of capacitors can include at least two sets of capacitors (e.g., similar to the first and second capacitor arrays 410, 420). The first set of capacitors can be configured to generate a cosine waveform based on the in-phase portion, and/or the second set of capacitors can be configured to generate a sine waveform based on the quadrature phase portion. The capacitive HRM 230, for example, can be configured to combine the cosine waveform and the sine waveform. In some embodiments, the combined cosine and sine waveform can be provided to an amplifier.

Additionally or alternatively, a multiple input multiple output (MIMO) analog core 250, for example, can be configured to separate a first signal and a second signal from the input signal. In some aspects, the separation can occur after the combined cosine and sine waveform is generated.

As non-limiting examples of benefits, the systems and/or methods described herein can be applied in cognitive radio, software defined radio, mixer-first receivers, and other settings in RF communication requiring agility in up/down frequency conversion covering a wide range of LO frequencies while suppressing possibly strong out-of-band blockers entering baseband due to mixer harmonic folding.

One or more aspects or features of the subject matter described herein can be realized in digital electronic circuitry, integrated circuitry, specially designed ASICs, field programmable gate arrays (FPGAs) computer hardware, firmware, software, and/or combinations thereof. These various aspects or features can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device. The programmable system or computing system can include clients and servers. A client and server are generally remote from each other and typically interact through a communication network. The relationship of client and server arises by virtue of computer programs running on the respective computers and having a client-server relationship to each other.

These computer programs, which can also be referred to as programs, software, software applications, applications, components, or code, include machine instructions for a programmable processor, and can be implemented in a high-level procedural language, an object-oriented programming language, a functional programming language, a logical programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium can store such machine instructions non-transitorily, such as for example as would a non-transient solid-state memory or a magnetic hard drive or any equivalent storage medium. The machine-readable medium can alternatively or additionally store such machine instructions in a transient manner, such as for example as would a processor cache or other random access memory associated with one or more physical processor cores.

To provide for interaction with a user, one or more aspects or features of the subject matter described herein can be implemented on a computer having a display device, such as for example a cathode ray tube (CRT) or a liquid crystal display (LCD) or a light emitting diode (LED) monitor for displaying information to the user and a keyboard and a pointing device, such as for example a mouse or a trackball, by which the user may provide input to the computer. Other kinds of devices can be used to provide for interaction with a user as well. For example, feedback provided to the user can be any form of sensory feedback, such as for example visual feedback, auditory feedback, or tactile feedback; and input from the user can be received in any form, including, but not limited to, acoustic, speech, or tactile input. Other possible input devices include, but are not limited to, touch screens or other touch-sensitive devices such as single or multi-point resistive or capacitive trackpads, voice recognition hardware and software, optical scanners, optical pointers, digital MRI image capture devices and associated interpretation software, and the like. As used herein, the term "module" refers to software functionality that can be implemented via one or more programmable processors that are part of one or more computing systems.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." Use of the term "based on," above and in the claims, is intended to mean "based on at least" and/or "based at least in part on," such that an unrecited feature or element is also permissible.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations can be within the scope of the following claims.

What is claimed is:

1. An apparatus, comprising:
   a receiver configured to receive an input signal, wherein the receiver is further configured to generate, based on the input signal, an in-phase portion and a quadrature phase portion;
   a harmonic rejection mixer comprising a plurality of capacitors, wherein the plurality of capacitors are encoded with a plurality of predetermined capacitance values, wherein the harmonic rejection mixer is configured to reduce harmonics in the input signal, and wherein the reduction is based on applying a quantity of the plurality of predetermined capacitance values to the input signal; and
   a plurality of switches configured to activate the plurality of capacitors, wherein the quantity of the plurality of predetermined capacitance values applied to the input signal is based on a quantity of the plurality of capacitors that are active.

2. The apparatus of claim 1, further comprising:
   a multi-phase local oscillator clock, wherein the plurality of switches activate the plurality of capacitors based on signals from the multi-phase local oscillator clock.

3. The apparatus of claim 2, wherein the plurality of switches are sequentially opened or closed based on the signals from the multi-phase local oscillator clock.

4. The apparatus of claim 1, wherein the predetermined capacitance values are based upon a capacitance of a corresponding capacitor from the plurality of capacitors.

5. The apparatus of claim 4, wherein at least a portion of the plurality of capacitors have different predetermined capacitance values.

6. The apparatus of claim 1, wherein the plurality of capacitors include a first set of capacitors and a second set of capacitors, wherein the first set of capacitors are configured to generate a cosine waveform based on the in-phase portion, wherein the second set of capacitors are configured to generate a sine waveform based on the quadrature phase portion, and wherein the harmonic rejection mixer is configured to combine the cosine waveform and the sine waveform.

7. The apparatus of claim 6, wherein combining the cosine waveform and the sine waveform provides a weighted signal based on the input signal, wherein the weighted signal comprises a signal that is downconverted from the received input signal, and wherein generating the weighted signal reduces a strength of an undesired signal present in the input signal.

8. The apparatus of claim 6, wherein the harmonic rejection mixer further includes a first amplifier configured to amplify the combined cosine waveform and sine waveform.

9. The apparatus of claim 1, further comprising:
   a multiple input multiple output analog core configured to separate a first signal from the input signal and a second signal from the input signal.

10. A method, comprising:
    receiving an input signal;
    generating, based on the input signal, an in-phase portion and a quadrature phase portion;
    activating a quantity of a plurality of capacitors; and
    reducing, via a harmonic rejection mixer comprising the plurality of capacitors, harmonics in the input signal, wherein the plurality of capacitors are encoded with a plurality of predetermined capacitance values, wherein the reducing is based on applying a quantity of the plurality of predetermined capacitance values to the input signal, and wherein the quantity of the plurality of predetermined capacitance values applied to the input signal is based on the quantity of the plurality of capacitors that are active.

11. The method of claim 10, wherein the plurality of capacitors are activated based on signals from a multi-phase local oscillator clock, wherein a plurality of switches are sequentially opened or closed based on the signals from the multi-phase local oscillator clock.

12. The method of claim 10, wherein the predetermined capacitance values are based upon a capacitance of a corresponding capacitor from the plurality of capacitors, and wherein at least a portion of the plurality of capacitors have different predetermined capacitance values.

13. The method of claim 10, wherein the applying further comprises:
    generating, via a first set of capacitors of the plurality of capacitors, a cosine waveform based on the in-phase portion;
    generating, via a second set of capacitors of the plurality of capacitors, a sine waveform based on the quadrature phase portion; and
    combining the cosine waveform and the sine waveform to provide a weighted signal based on the input signal, wherein the weighted signal comprises a signal that is downconverted from the received input signal.

14. The method of claim 10, further comprising:
    separating, via a multiple input multiple output analog core, a first signal from the input signal and a second signal from the input signal.

15. A computer program product comprising a non-transitory machine-readable medium storing instructions that, when executed by at least one programmable processor, cause the at least one programmable processor to perform operations comprising:
    generating, based on the input signal, an in-phase portion and a quadrature phase portion;
    activating a quantity of a plurality of capacitors; and
    reducing, via a harmonic rejection mixer comprising the plurality of capacitors, harmonics in the input signal, wherein the plurality of capacitors are encoded with a plurality of predetermined capacitance values, wherein the reducing is based on applying a quantity of the plurality of predetermined capacitance values to the input signal, and wherein the quantity of the plurality of predetermined capacitance values applied to the input signal is based on the quantity of the plurality of capacitors that are active.

16. The computer program product of claim 15, wherein the plurality of capacitors are activated based on signals from a multi-phase local oscillator clock, wherein a plurality of switches are sequentially opened or closed based on the signals from the multi-phase local oscillator clock.

17. The computer program product of claim 15, wherein the predetermined capacitance values are based upon a capacitance of a corresponding capacitor from the plurality of capacitors, and wherein at least a portion of the plurality of capacitors have different predetermined capacitance values.

18. The computer program product of claim 15, wherein the applying further comprises:
- generating, via a first set of capacitors of the plurality of capacitors, a cosine waveform based on the in-phase portion;
- generating, via a second set of capacitors of the plurality of capacitors, a sine waveform based on the quadrature phase portion; and
- combining the cosine waveform and the sine waveform to provide a weighted signal based on the input signal, wherein the weighted signal comprises a signal that is downconverted from the received input signal.

19. The computer program product of claim 15, wherein the operations further comprise:
- separating, via a multiple input multiple output analog core, a first signal from the input signal and a second signal from the input signal.

* * * * *